(12) United States Patent
Lee et al.

(10) Patent No.: US 12,356,575 B2
(45) Date of Patent: Jul. 8, 2025

(54) ELECTRONIC APPARATUS HAVING ELECTRONIC CONTROL DEVICE

(71) Applicant: LS ELECTRIC CO., LTD., Anyang-si (KR)

(72) Inventors: Su Hyeong Lee, Anyang-si (KR); Soo Yong Hwang, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 163 days.

(21) Appl. No.: 18/268,029

(22) PCT Filed: Nov. 25, 2021

(86) PCT No.: PCT/KR2021/017485
§ 371 (c)(1),
(2) Date: Jun. 16, 2023

(87) PCT Pub. No.: WO2022/131609
PCT Pub. Date: Jun. 23, 2022

(65) Prior Publication Data
US 2024/0057276 A1    Feb. 15, 2024

(30) Foreign Application Priority Data

Dec. 18, 2020 (KR) ........................ 10-2020-0178151

(51) Int. Cl.
*H05K 7/14* (2006.01)
*H02M 7/00* (2006.01)
*H02M 7/42* (2006.01)

(52) U.S. Cl.
CPC ........ *H05K 7/14327* (2022.08); *H02M 7/003* (2013.01); *H02M 7/42* (2013.01)

(58) Field of Classification Search
None
See application file for complete search history.

(56) References Cited

U.S. PATENT DOCUMENTS

2007/0284418 A1    12/2007 Mori et al.
2019/0165687 A1*   5/2019 Yamazawa ................. C09J 7/22
(Continued)

FOREIGN PATENT DOCUMENTS

JP          09081270 A    3/1997
JP       2006014476 A    1/2006
(Continued)

OTHER PUBLICATIONS

International Search Report for related International Application No. PCT/KR2021/017485; action dated Jun. 23, 2022; (5 pages).

(Continued)

*Primary Examiner* — Krystal Robinson
(74) *Attorney, Agent, or Firm* — K&L Gates LLP

(57) ABSTRACT

Provided is an electronic apparatus having an electronic control device. An electronic apparatus having an electronic control device, according to one embodiment of the present disclosure, may comprise: the electronic control device having a first coupling part and an electronic control device groove part; a bracket including a side wall having a bracket protrusion to be coupled to the electronic control device groove part and a fixing member protrusion seating groove to be coupled to the first coupling part, wherein the bracket includes a pair of second coupling parts and a pair of third coupling parts and has a through-hole formed in the central portion thereof; a housing which includes a pair of fourth coupling parts and a pair of fifth coupling parts formed on a first surface, and has an electronic apparatus disposed therein; and a circuit board electrically connected to the electronic apparatus and electrically connected to the electronic control device via the through-hole.

16 Claims, 12 Drawing Sheets

(56) References Cited

U.S. PATENT DOCUMENTS

| | | | |
|---|---|---|---|
| 2021/0168960 A1* | 6/2021 | Kothari | H02M 7/003 |
| 2023/0327547 A1* | 10/2023 | Wang | H05K 7/14327 |
| | | | 307/151 |

FOREIGN PATENT DOCUMENTS

| KR | 20010097971 A | 11/2001 |
|---|---|---|
| KR | 20190095734 A | 8/2019 |
| KR | 20200089126 A | 7/2020 |

OTHER PUBLICATIONS

Written Opinion for related International Application No. PCT/KR2021/017485; action dated Jun. 23, 2022; (5 pages).
Extended European Search Report for related European Application No. 21906914.3; action dated Nov. 5, 2024; (43 pages).

* cited by examiner (a)  (b)

(a)　　　　　　　　　(b)

(a)

(b)

(c)

ELECTRONIC APPARATUS HAVING ELECTRONIC CONTROL DEVICE

CROSS-REFERENCE TO RELATED APPLICATION

This application is a National Stage of International Application No. PCT/KR2021/017485 filed on Nov. 25, 2021, which claims priority to and the benefit of Korean Patent Application No. 10-2020-0178151, filed on Dec. 18, 2020, the disclosure of which is incorporated herein by reference in its entirety.

FIELD

The present disclosure relates to an electronic apparatus having an electronic control device, and more specifically to an electronic apparatus having an electronic control device which is capable of easily opening and closing a bracket in which the electronic control device for operating an electronic apparatus such as an inverter or the like that controls a motor is installed.

BACKGROUND

In order to operate and control an inverter, generally, the electronic control device called an operator panel is used. Such an electronic control device c des various switches for operating the inverter, a display for monitoring and the like.

Inverters that are operated by such an electronic control device are generally designed such that the bracket in which the electronic control device is installed can be opened and closed from the inverter so that the user can replace parts of the inverter according to the required specifications or facilitate repairs due to inverter failure.

However, conventionally, the screw coupling method has been used to open and close the bracket. In addition, without a separate method for fixing the bracket in the open state, the bracket has been dependent on the frictional force due to screw coupling.

Therefore, as the number of opening and closing of the bracket increases due to the user's use, the screw coupling becomes loose, resulting in a problem in that the bracket cannot be fixed.

In addition, when the screw coupling is tight, it is difficult for the user to open and close the bracket itself, and when opening and closing the bracket with excessive force, there may be a problem in that the bracket is damaged.

Furthermore, when the used screws are discontinued, follow-up management is difficult, and there is also a problem of increased lead time for screw coupling during the inverter production.

Therefore, demand has arisen for a structure that can easily use an inverter operated by an electronic control device, has excellent durability and can reduce the lead time and manufacturing cost during manufacturing.

SUMMARY

An object of the present disclosure is to provide an electronic apparatus having an electronic control device which is capable of easily detaching the electronic control device from the electronic apparatus.

In addition, an object of the present disclosure is to provide an electronic apparatus having an electronic control device which is capable of reducing the lead time and manufacturing cost of manufacturing the electronic apparatus by simplifying the structure of a bracket in which the electronic control device is installed.

In addition, an object of the present disclosure is to provide an electronic apparatus having an electronic control device which is capable of easily opening and closing a bracket in which an electronic control device is installed and maintaining a safe open state of the bracket.

In addition, an object of the present disclosure is to provide an electronic apparatus having an electronic control device which has excellent durability even when the number of times of usage is high.

In addition, an object of the present disclosure is to provide an electronic apparatus having an electronic control device which has a high degree of freedom in the design of the electronic apparatus.

The problems of the present disclosure are not limited to the aforementioned problems, and other problems that are not mentioned will be clearly understood by those skilled in the art from the description below.

In order to solve the above problems, the electronic apparatus having an electronic control device according to an aspect of the present disclosure may include an electronic control device having a first coupling part on one side and an electronic control device groove part on the other side; a bracket including a side wall having a bracket protrusion to be coupled to the electronic control device groove part and a fixing member protrusion seating groove to be coupled to the first coupling part such that the electronic control device is fixed, wherein the bracket includes a pair of second coupling parts and a pair of third coupling parts and has a through-hole formed in the central portion thereof; a housing which includes a pair of fourth coupling parts which are coupled to the second coupling parts such that the bracket is disposed on a first surface and a pair of fifth coupling parts which are coupled to the third coupling parts on the first surface, wherein an electronic apparatus which is controlled by the electronic control device is disposed therein; and a circuit board electrically which is disposed between the first surface of the housing and the bracket, fixed to the first surface, electrically connected to the electronic apparatus and electrically connected to the electronic control device via the through-hole, wherein the second coupling part is formed such that the bracket can rotate about the second coupling part in a state where the third coupling part is separated from the fifth coupling part and the second coupling part is coupled to the fourth coupling part.

In this case, the housing may include a stopper which is disposed adjacent to the fourth coupling part and is formed to protrude from the first surface, wherein a stopper support surface may be formed at one side end of the bracket, and when the bracket rotates about the second coupling part, the stopper support surface may be formed such that a first angle formed by the bracket and the first surface of the housing is supported by one end surface of the stopper at a predetermined angle, and wherein a rotation fixing protrusion may be formed on one end surface of the stopper, a rotation fixing part may be formed on one side of the bracket, and the rotation fixing part may be engaged with the rotation fixing protrusion such that the first angle maintains the predetermined angle in a state where the third coupling part is separated from the fifth coupling part and the second coupling part is coupled to the fourth coupling part.

In this case, the rotating fixing part may include a rotation fixing protrusion seating groove which is formed on the stopper support surface and in which the rotation fixing protrusion is seated; a pair of fixing bars which are formed to extend from one inner surface of the rotation fixing protrusion seating groove so as to be adjacent to both side surfaces of the rotation fixing protrusion; and a separation preventing member which is formed to protrude from a side surface adjacent to the rotation fixing protrusion of one end of the fixing bar such that the rotation fixing protrusion does not escape to the outside.

In this case, when the rotation fixing protrusion is fastened to the rotation fixing part, a first guide surface having an inclination so as to guide the rotation fixing protrusion between the pair of fixing bars may be formed on one surface of the rotation fixing protrusion.

In this case, when the rotating fixing protrusion is introduced between the pair of fixing bars, the pair of fixing bars and the inner surface of the groove may be spaced apart such that the fixing bar can be elastically deformed.

In this case, when the rotation fixing protrusion is fastened to the rotation fixing part, a second guide surface having an inclination so as to guide the rotation fixing protrusion between the pair of fixing bars may be formed on one surface of the separation preventing member in a direction in which the rotation fixing protrusion is introduced.

In this case, a third guide surface having an inclination so as to guide the rotation fixing protrusion to be separated from between the pair of fixing bars may be formed on the other surface of the separation preventing member in a direction opposite to the direction in which the rotation fixing protrusion is introduced.

Meanwhile, in the electronic apparatus having an electronic control device according to an aspect of the present disclosure, the pair of second coupling parts may include a rotating member which is formed to protrude in a cylindrical shape from both side surfaces of one end of the bracket, wherein the pair of fourth coupling parts may include a supporting member which is formed to protrude from the first surface of the housing; and a supporting member seating groove into which the rotation member is introduced and seated at one end of the supporting member, and wherein the supporting member seating groove may be formed such that the inner surface of a side into which the rotating member is introduced is formed to protrude so as to prevent the rotating member from escaping in a state where the rotating member is seated.

In this case, the electronic apparatus may further include a fixing member which is formed at one end of the outer side of the rotating member so as to prevent the second coupling part from moving in the direction of a rotation axis of the bracket in a state where the second coupling part is coupled to the fourth coupling part.

In this case, in the supporting member seating groove, an elastic groove may be formed in the longitudinal direction of the supporting member from the supporting member seating groove such that the supporting member seating groove elastically widens when the rotating member is introduced into the supporting member seating groove.

In this case, a rotating member guide surface having an inclination so as to guide the rotating member to be introduced may be formed on the inner surface of the supporting member seating groove into which the rotating member is introduced.

In this case, the third coupling part may include a pair of cover supporting members which are formed to extend from both side surfaces of the bracket; a pair of elasticity providing members which are formed to bent toward the first surface at one end of the cover supporting member; an elasticity providing member protrusion which is formed to protrude from one end of the elasticity providing member; and an elasticity providing member handle which is formed at one end of the elasticity providing member, wherein the fifth coupling part may include an elasticity providing member supporting member which is formed to extend from the first surface so as to correspond to the pair of elasticity providing members; and an elasticity providing member protrusion seating groove which is formed at one end of the elasticity providing member supporting member such that the elasticity providing member protrusion is seated therein, and wherein as the elasticity providing member handle is pressed toward the bracket, the elasticity providing member may be elastically deformed such that the elasticity providing member protrusion is seated in the elasticity providing member protrusion seating groove.

In this case, the electronic apparatus may further include a cover which is formed with an opening to expose one surface of the electronic control device to the outside and covers the one surface of the housing, wherein a supporting part which is formed to protrude to support the cover in contact with the cover supporting member in a state where the cover is coupled to the housing may be provided on one surface opposite to the first surface of the cover.

In this case, the bracket may be formed such that the side wall of the bracket is disposed adjacent to the inner side of the edge of the opening, and wherein the cover may be formed to be inclined from the edge of the opening to the edge of the cover such that the height of the side wall end from the first surface and the height of the edge of the opening from the first surface coincide with each other.

Meanwhile, in the electronic apparatus having an electronic control device according to an aspect of the present disclosure, the electronic control device and the circuit board may be electrically connected through a wire passing through the through-hole, and wherein the wire may have a predetermined length such that the electronic control device and the circuit board can be electrically connected even in a state where the rotation fixing protrusion is coupled to the rotation fixing part.

Meanwhile, in the electronic apparatus having an electronic control device according to an aspect of the present disclosure, at least one pair of electronic control device fixing parts which are disposed to be opposite to each other may be formed on the side wall of the bracket, and wherein the electronic control device fixing part may include an elasticity providing hole which is formed in a U-shape; an elasticity providing bar which is formed on the side wall by the elasticity providing hole; and an electronic control device fixing protrusion which is formed on the inner surface of the elasticity providing bar.

Meanwhile, in the electronic apparatus having an electronic control device according to an aspect of the present disclosure, the first coupling part may include an electronic control device fixing member which is formed to be bent toward the first surface at one end of the electronic control device; a fixing member protrusion which is formed to protrude from one end of the electronic control device fixing member; and a fixing member handle which is formed at one end of the electronic control device fixing member, and wherein as the fixing member handle is pressed, the electronic control device fixing member may be elastically deformed such that the fixing member protrusion is seated in the fixing member protrusion seating groove.

The electronic apparatus having an electronic control device according to an exemplary embodiment of the present disclosure can easily detach the electronic control device from the electronic apparatus.

In addition, the electronic apparatus having an electronic control device according to an exemplary embodiment of the present disclosure can reduce the lead time and manufacturing cost of manufacturing the electronic apparatus by simplifying the structure of a bracket in which the electronic control device is installed.

In addition, the electronic apparatus having the electronic control device according to an exemplary embodiment of the present disclosure can easily open and close a bracket in which the electronic control device is installed, and keep the bracket safely open.

In addition, the electronic apparatus having an electronic control device according to an exemplary embodiment of the present disclosure can increase the degree of freedom in the design of the electronic apparatus.

In addition, the electronic apparatus having an electronic control device according to an exemplary embodiment of the present disclosure can increase durability in an environment with many uses.

The effects of the present disclosure are not limited to the above effects, and it should be understood to include all effects that can be inferred from the description of the present disclosure or the configuration of the disclosure described in the claims.

DETAILED DESCRIPTION

Figure 1:
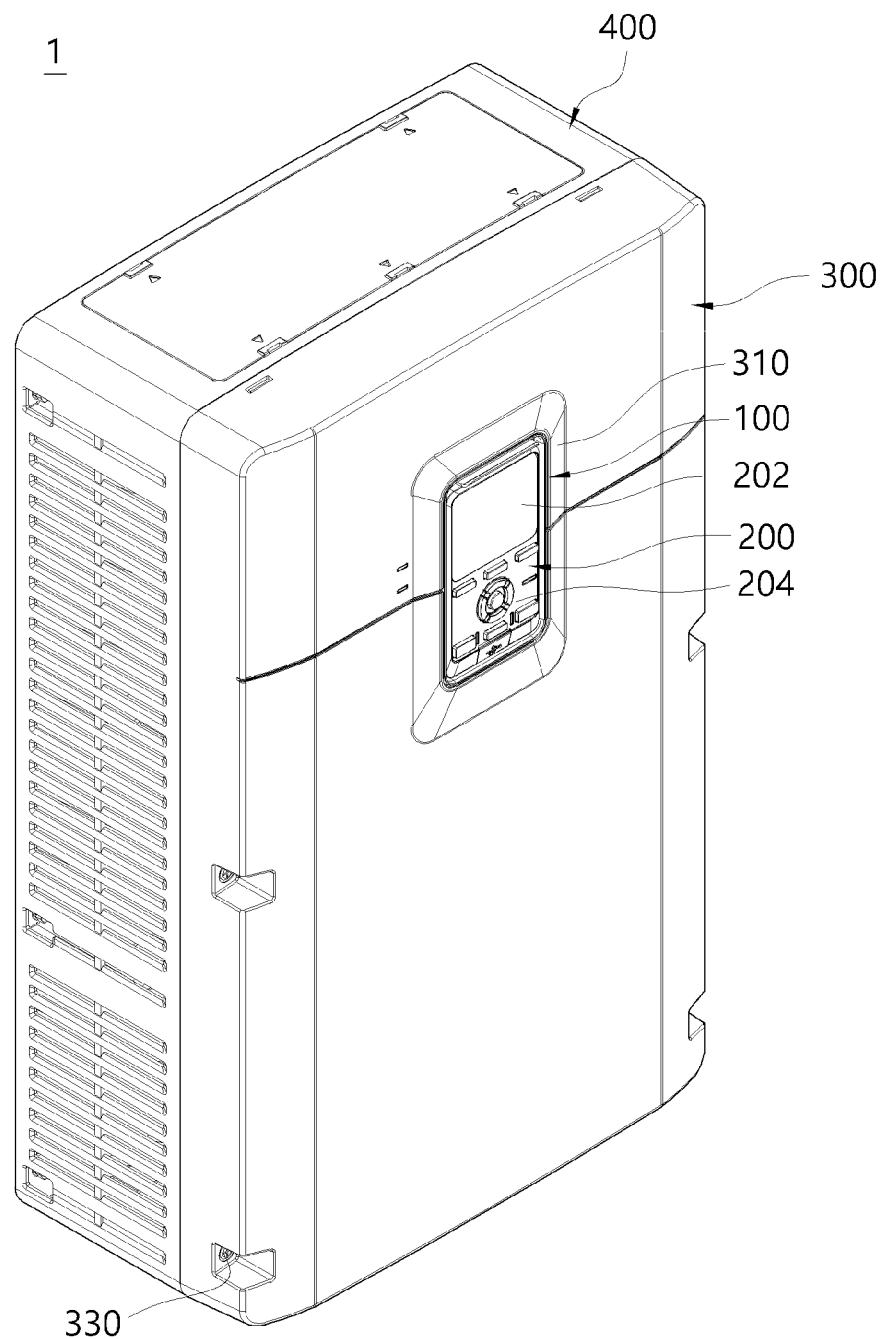
FIG. 1 is a perspective view of the electronic apparatus having an electronic control device according to an exemplary embodiment of the present disclosure.

Hereinafter, with reference to the accompanying drawings, the exemplary embodiments of the present disclosure will be described in detail so that those of ordinary skill in the art to which the present disclosure pertains can easily practice the present disclosure. The present disclosure may be embodied in many different forms and is not limited to the exemplary embodiments described herein. In order to clearly describe the present disclosure in the drawings, parts that are irrelevant to the description are omitted, and the same reference numerals are assigned to the same or similar components throughout the specification.

Terms such as 'first' and 'second' may be used to describe various elements, but the elements should not be limited by the above terms. The above terms may be used only for the purpose of distinguishing one component from another. For example, without departing from the scope of the present disclosure, a 'first component' may be termed a 'second component', and similarly, a 'second component' may also be termed a 'first component'. In addition, the singular expression includes the plural expression unless the context clearly dictates otherwise. Unless otherwise defined, terms that are used in the exemplary embodiments of the present disclosure may be interpreted as meanings commonly known to those of ordinary skill in the art.

The present disclosure provides an electronic apparatus having an electronic control device which is capable of easily opening and closing a bracket installed with an electronic control device for operating the electronic apparatus. In particular, as an exemplary embodiment of the present disclosure, the electronic apparatus having an electronic control device may be an inverter for controlling a motor. However, the electronic apparatus is not limited to the inverter for controlling the motor.

Figure 2:
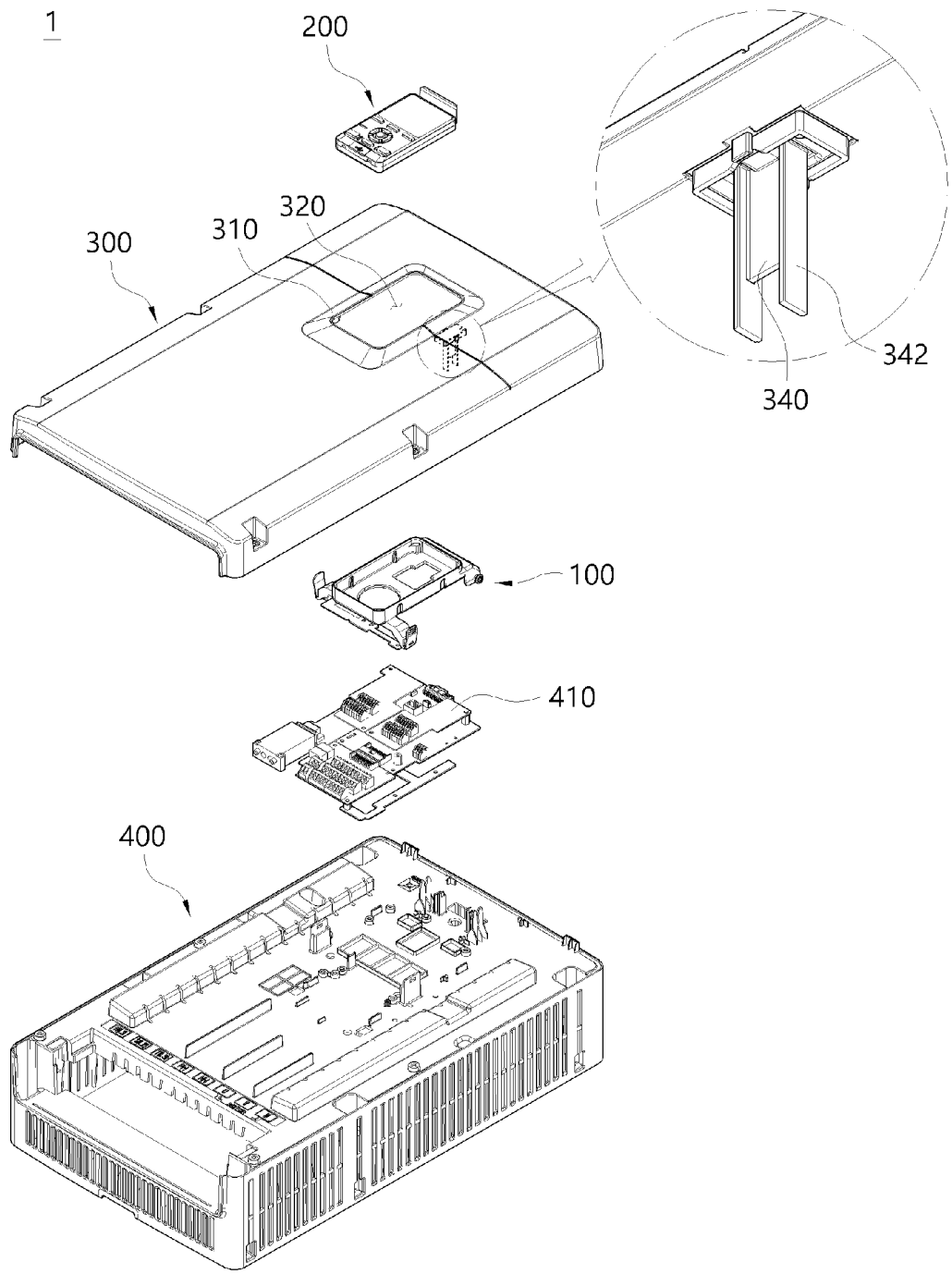
FIG. 2 is an exploded perspective view of the electronic apparatus having an electronic control device according to an exemplary embodiment of the present disclosure.
Figure 3:
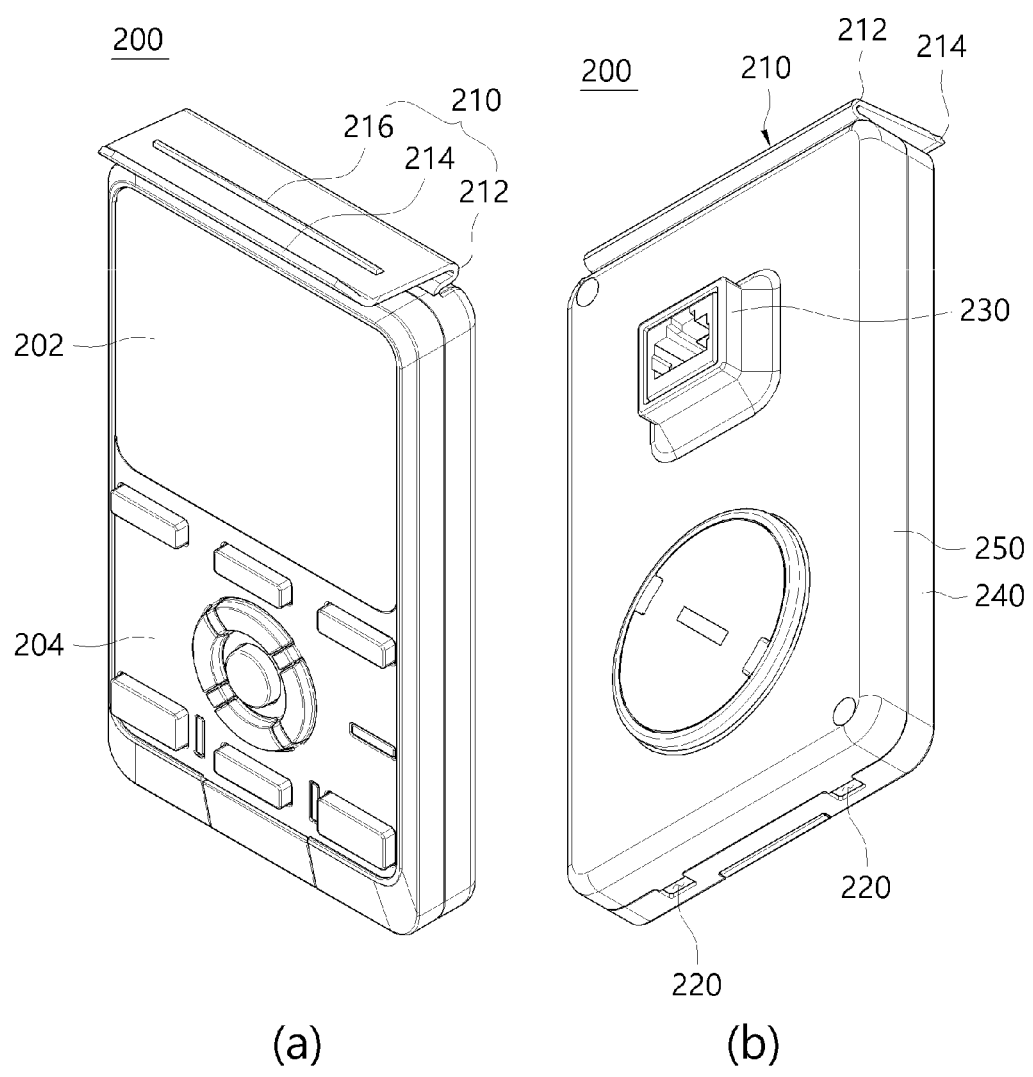
FIG. 3 (a) is a front perspective view of the electronic control device of the electronic apparatus having an electronic control device according to an exemplary embodiment of the present disclosure, and FIG. 3 (b) is a rear perspective view of the electronic control device of the electronic apparatus having an electronic control device according to an exemplary embodiment of the present disclosure.

FIG. 1 is a perspective view of the electronic apparatus having an electronic control device according to an exemplary embodiment of the present disclosure, and FIG. 2 is an exploded perspective view of the electronic apparatus having an electronic control device according to an exemplary embodiment of the present disclosure. FIG. 3 (*a*) is a front perspective view of the electronic control device of the electronic apparatus having an electronic control device according to an exemplary embodiment of the present disclosure, and FIG. 3 (*b*) is a rear perspective view of the electronic control device of the electronic apparatus having an electronic control device according to an exemplary embodiment of the present disclosure.

As illustrated in FIGS. 1 and 2, the electronic apparatus 1 having an electronic control device according to an exemplary embodiment of the present disclosure includes a bracket 100, an electronic control device 200 and a housing 400.

The user controls the electronic apparatus 1 by operating the electronic control device 200. In this case, in order for the user to control the electronic apparatus 1, the electronic control device 200 may include a display unit 202 for displaying information on the electronic apparatus 1, for example, a menu for the status and operation of the electronic apparatus 1, and a button unit 204 for the user to transmit a command to the electronic apparatus 2 according to information displayed through the display unit 202.

Since the present disclosure is characterized in that the electronic control device 200 is installed in the electronic apparatus 1, the principle of the electronic control device 200 controlling the electronic apparatus 1 or the detailed description of a method of transmitting a command to the electronic apparatus 1 by the user by using the electronic control device 200 will be omitted in the present specification.

In addition, hereinafter, the direction in which the display unit 202 faces in the drawings is defined as the front side, and the opposite side is defined as the rear side.

The shape of the electronic control device 200 is not limited, but is preferably formed in a rectangular parallelepiped shape for easy manufacturing and user-friendly use. Hereinafter, for the convenience of description, the electronic control device 200 will be described as being formed as a rectangular parallelepiped as illustrated in FIGS. 1 to 3.

As illustrated in FIGS. 3 (*a*) and (*b*), the inside of the electronic control device 200 may be protected by a first electronic control device cover 240 and a second electronic control device cover 250. In this case, the shapes of the first electronic control device cover 240 and the second electronic control device cover 250 are not limited. In addition, the first electronic control device cover 240 and the second electronic control device cover 250 may be integrally formed.

Meanwhile, as illustrated in FIGS. 1 to 3, the electronic control device 200 of the electronic apparatus 1 having an electronic control device according to an exemplary embodiment of the present disclosure includes a first coupling part 210, an electronic control device groove part 220 and a connection part 230.

The first coupling part 210 is provided on one side of the electronic control device 200. In this case, it is preferable to be provided at the short edge of the edges of the electronic control device 200 formed by the formation of a rectangular parallelepiped.

As illustrated in FIGS. 3 (*a*) and (*b*), the first coupling part 210 includes an electronic control device fixing member 212 which is formed to be bent in the opposite direction in which the display unit 202 of the electronic control device 200 is installed.

A fixing member handle 214 is formed at one end of the opposite side to the side on which the electronic control device fixing member 212 of the electronic control device 200 is disposed. The user may elastically deform the electronic control device fixing member 212 by pressing the fixing member handle 214.

In a state where the user presses the fixing member handle 214, an elastic force is provided in a direction in which the electronic control device fixing member 212 is restored to its original shape. In addition, when the user stops pressing the fixing member handle 214, the electronic control device fixing member 212 is restored to its original shape.

A fixing member protrusion 216 is formed to protrude from one end of the electronic control device fixing member 212. The size or shape of the fixing member protrusion 216 is not limited and may be formed to extend in length as illustrated in FIG. 3 (*a*).

Meanwhile, as illustrated in FIGS. 3 (*a*) and (*b*), an electronic control device groove part 220 is formed on the opposite side of the side on which the first coupling part 210 of the electronic control device 200 is provided. This is because the first coupling part 210 is fixed to a bracket 100 in a state where the bracket protrusion 112 to be described below is coupled to the electronic control device groove part 220. However, the structure in which the first coupling part 210 is fixed to the bracket 100 will be described below.

There is no limit to the number of the electronic control device groove parts 220, and as long as they are formed to correspond to the shape of the bracket protrusions 112 formed on the bracket 100 to be described below, there is no limitation in the exemplary embodiments.

Meanwhile, in the electronic control device 200, the connection part 230 is formed on the surface opposite to the surface on which the display part 202 is provided. A wire (not illustrated) is connected to the connection part 230 and is connected to be energized with the electronic apparatus 1 through the wire (not illustrated). The method in which a wire (not illustrated) is connected to the connection unit 230 may be connected according to various known methods.

The connection part 230 may be formed to protrude from the electronic control device 200 as illustrated in FIG. 3 (*b*).

Figure 4:
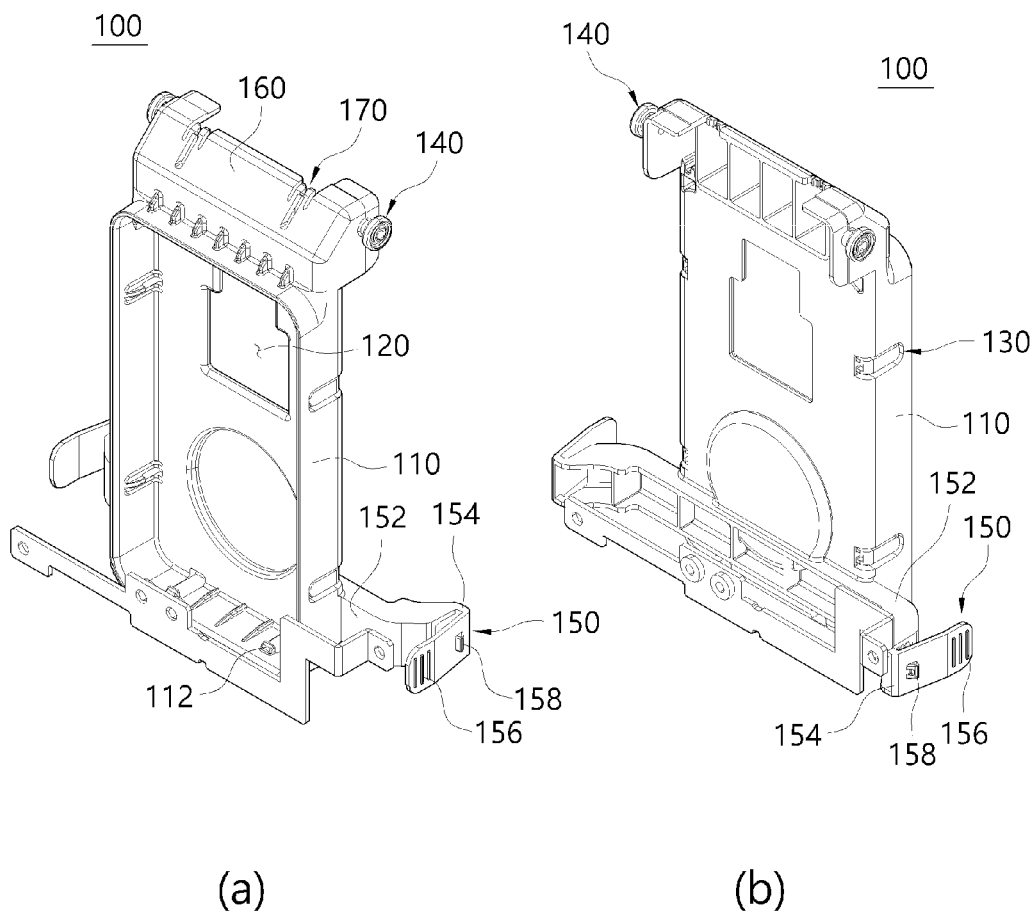
FIG. 4 (a) is a front perspective view of the bracket of the electronic apparatus having an electronic control device according to an exemplary embodiment of the present disclosure, and FIG. 4 (b) is a rear perspective view of the bracket of the electronic apparatus having an electronic control device according to an exemplary embodiment of the present disclosure.
Figure 5:
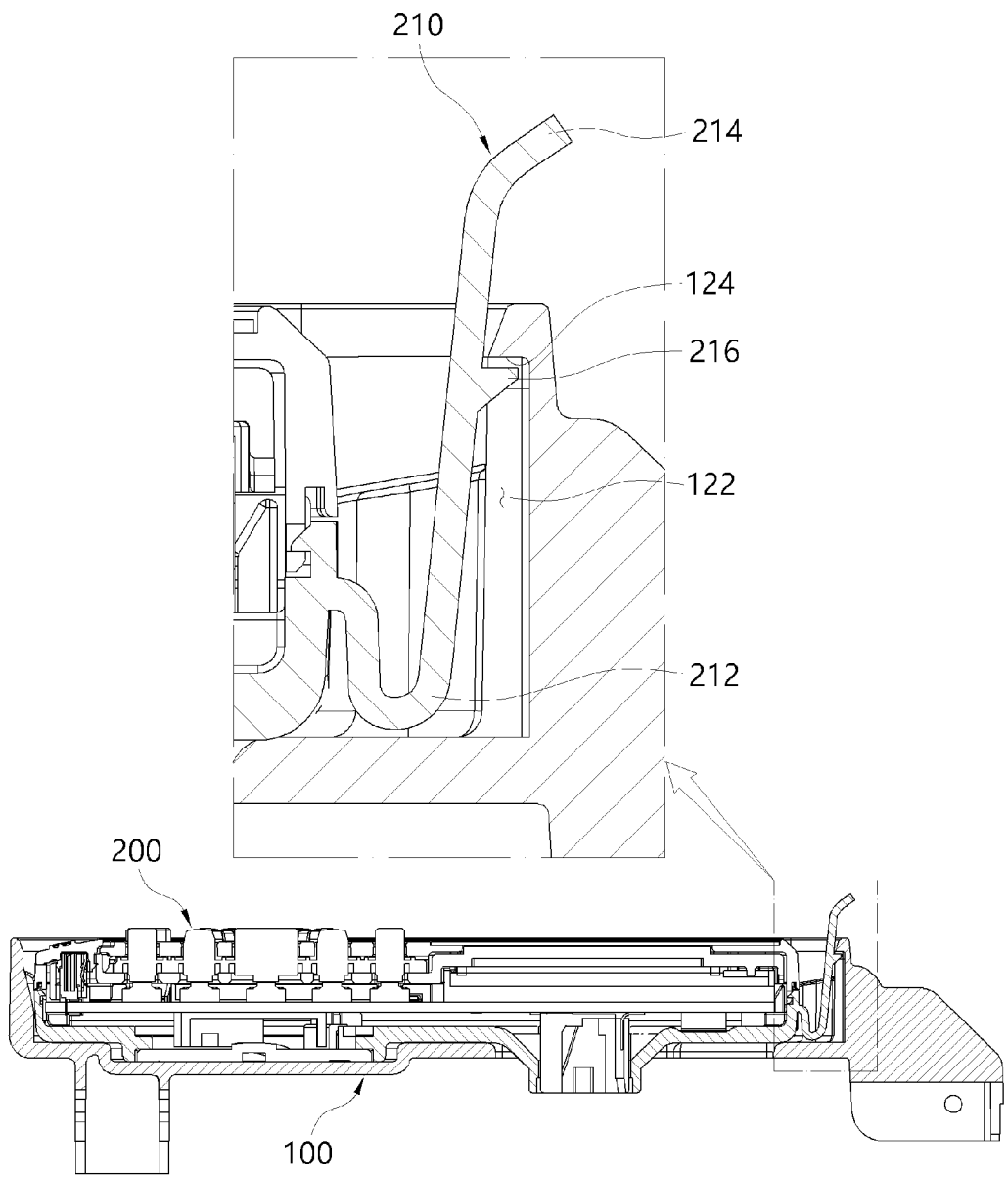
FIG. 5 is a cross-sectional view of the bracket of the electronic apparatus having an electronic control device according to an exemplary embodiment of the present disclosure.
Figure 6:
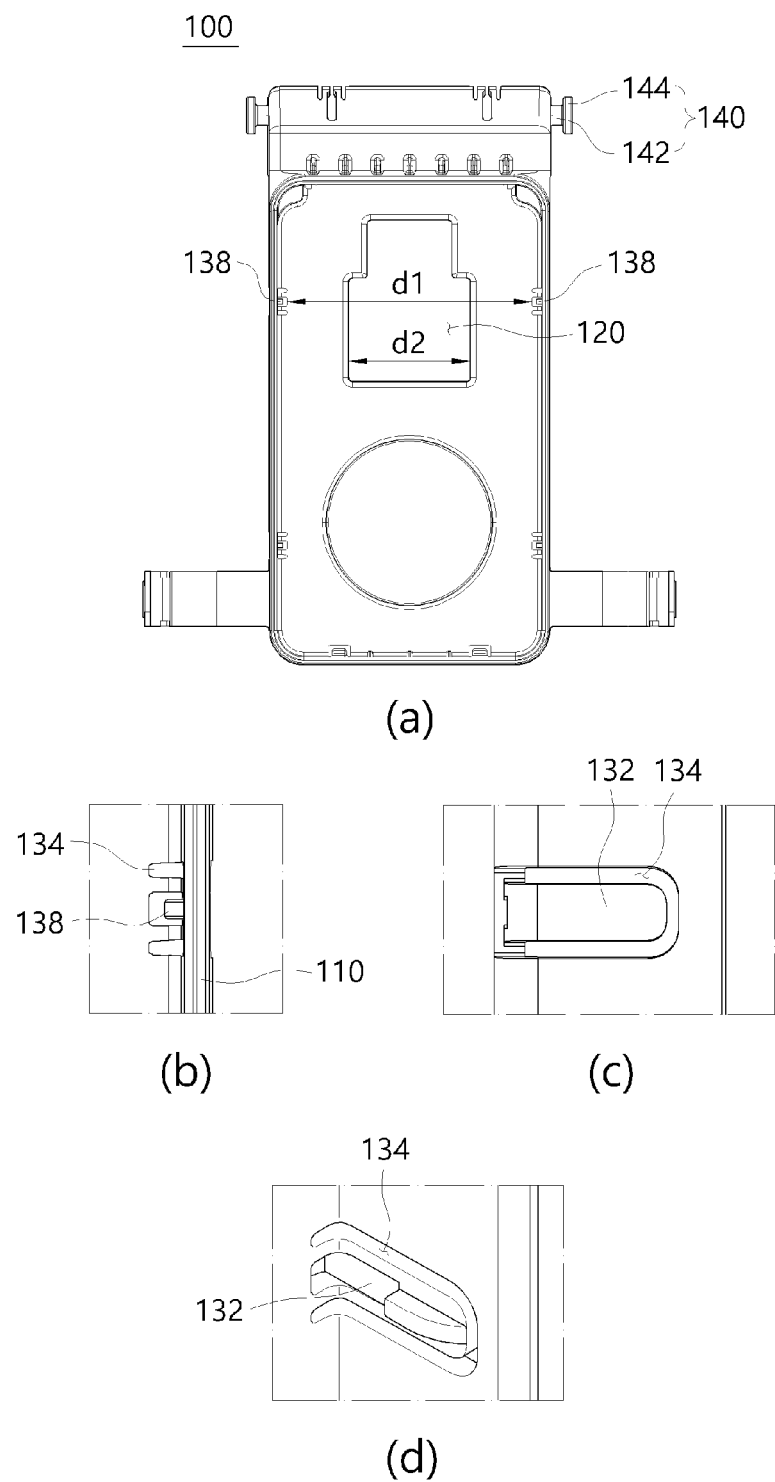
FIG. 6 (a) is a top view of the bracket of the electronic apparatus having an electronic control device according to an exemplary embodiment of the present disclosure, FIG. 6 (b) is a top view of the electronic control device fixing part of the electronic apparatus having an electronic control device according to an exemplary embodiment of the present disclosure, FIG. 6 (c) is a side view of the electronic control device fixing part of the electronic apparatus having the electronic control device according to an exemplary embodiment of the present disclosure, and FIG. 6 (d) is a perspective view of the electronic control device fixing part of the electronic apparatus having an electronic control device according to an exemplary embodiment of the present disclosure.

FIGS. 4 (*a*) and (*b*) are a front perspective view and a rear perspective view of the bracket of the electronic apparatus having an electronic control device according to an exemplary embodiment of the present disclosure, respectively, FIG. 5 is a cross-sectional view of the bracket of the electronic apparatus having an electronic control device according to an exemplary embodiment of the present disclosure, and FIGS. 6 (*a*) to (*d*) are is a top view of the bracket, a top view of the electronic control device fixing part, a side view of the electronic control device fixing part and a perspective view of the electronic control device fixing part of the electronic apparatus having an electronic control device according to an exemplary embodiment of the present disclosure, respectively.

As illustrated in FIGS. 4 (*a*) and (*b*), the bracket 100 of the electronic apparatus 1 having an electronic control device according to an exemplary embodiment of the present disclosure includes a side wall 110, a through-hole 120, an electronic control device fixing part 130, a pair of second coupling parts 140 and a third coupling part 150.

As illustrated in FIGS. 4 (*a*) and (*b*), the bracket 100 is provided with a side wall 110 such that the electronic control device 200 is seated therein. That is, the side wall 110 is formed to surround the periphery of the side of the electronic control device 200 in a state where the electronic control device 200 is arranged side by side with the bracket 100. Accordingly, in a state where the electronic control device 200 is seated on the bracket 100, one side of the electronic control device 200, preferably, the surface on which the display unit 202 is provided is also exposed to the outside.

In this case, in a state where the electronic control device 200 is seated, the bracket protrusion 112 is formed on the inner side of the side wall 110 on the side where the electronic control device groove 220 is located. The bracket protrusion 112 is formed to protrude inward from the side wall 110.

In this case, the bracket protrusion 112 is coupled to the electronic control device groove 220 such that the electronic control device may be fixed to the bracket 100. Therefore, it is preferable that the electronic control device groove 220 and the bracket protrusion 112 have the same shape such that they can be matched.

In addition, it is preferable that the surface formed on the front side of the bracket protrusion 112 and the inner surface of the electronic control device groove 220 are formed to be in close contact with each other.

As illustrated in FIG. 5, a fixing member protrusion seating groove 122 is formed on the inner side of the side wall 110 opposite to the side wall 110 on which the bracket protrusion 112 is formed.

The fixing member protrusion seating groove 122 is coupled to the first coupling part 210 provided in the electronic control device 200 to fix the electronic control device 200 to the bracket 100. That is, in the electronic control device 200, the first coupling part 210 and the fixing member protrusion seating groove 122 are coupled to each other in a state where the bracket protrusion 112 is fitted to the electronic control device groove part 220, so as to be fixed to the bracket 100.

In more detail, as illustrated in FIG. 5, when the user presses the fixing member handle 214 and the electronic control device fixing member 212 is elastically deformed, the electronic control device 200 is disposed on the inner side of the side wall 110 in a state where the bracket protrusion 112 is fitted to the electronic control device groove part 220. In this case, since the electronic control device fixing member 212 provides an elastic force to return to its original shape, the fixing member protrusion 216 is disposed in the fixing member protrusion seating groove 122. In this state, the fixing member protrusion 216 is not separated to the outside by an locking protrusion 124 which is formed on the upper end of the fixing member protrusion seating groove 122.

In this case, in order for the user to easily couple the first coupling part 210 to the fixing member protrusion seating groove 122, as illustrated in FIG. 5, the side surface of the bracket 100 of the fixing member protrusion 216 may be formed to be inclined. In addition, when the fixing member protrusion 216 is in contact, the front side of the locking protrusion 124 may be inclined to induce a seating process.

Meanwhile, as illustrated in FIGS. 4 and 6 (a), a through-hole 120 is formed in the central portion of the bracket 100. The shape of the through-hole 120 is not limited, but for the convenience of description, hereinafter, it is described by defining as being formed in a rectangular shape.

As illustrated in FIG. 3 (b), when the connection part 230 is formed to protrude from the electronic control device 200, the size of the through-hole 120 should be formed to be the same as the cross-sectional area of the connection part 230 or at least larger than the cross-sectional area of the connection part 230.

In this case, when the shape of the through-hole 120 and the shape of the cross-sectional area of the connection part 230 which is formed to protrude match, there is an advantage in that the electronic control device 200 is effectively fixed to the bracket 100.

Since a wire (not illustrated) connected to the connection part 230 is connected to the electronic apparatus 1 through the through-hole 120, it is preferable that the size of the through-hole 120 is formed to have at least a horizontal and vertical length d2 of 24 mm to 36 mm such that two or more fingers of the user can easily enter therein. Through this, there is an advantage in that the user may easily install or remove a wire (not illustrated).

In addition, as illustrated in FIG. 6 (a), the through-hole 120 may be formed to be wider at one side. Through this, it is possible to solve the problem that the wire (not illustrated) connected to the connection part 230 becomes relatively short while the bracket 100 is open.

In this case, it is preferable that a wire (not illustrated) which is disposed to penetrate through the through-hole 120 has a sufficient length to be connected to the electronic control device 200 and the electronic apparatus 1 or the circuit board 410 to be described below, even when the bracket 100 is open.

Meanwhile, as illustrated in FIGS. 6 (a) to (d), the electronic control device fixing part 130 is formed on the side wall 110 of the electronic apparatus 1 having an electronic control device according to an exemplary embodiment of the present disclosure.

The electronic control device fixing part 130 serves to fix the electronic control device 200 such that it can be disposed in the center of the bracket 100 in a state where the electronic control device 200 is seated on the bracket 100. Through this, even if the size of the electronic control device 200 is somewhat smaller than the bracket 100, there is an advantage in that the electronic control device 200 can be firmly fixed to the bracket 100. In particular, there is an advantage in that it can be firmly fixed to the bracket 100 even if an error occurs in the size of the electronic control device 200 during the manufacturing process.

The electronic control device fixing part 130 is formed in pairs and is disposed to be opposite to the side wall 110 of the bracket 100. In this case, there is no limit to the number of the electronic control device fixing parts 130 is installed. However, in order to more firmly fix the electronic control device 200, as illustrated in FIG. 6 (a), it is preferable to provide at least two pairs or more.

Meanwhile, the electronic control device fixing part 130 of the electronic apparatus having an electronic control device according to an exemplary embodiment of the present disclosure includes an elasticity providing hole 134 which is formed in a U-shape on the side wall 110, an elasticity providing bar 132 which is formed on the side wall 110 by the elasticity providing hole 134, and an electronic control device fixing protrusion 138 which is formed on the inner surface of the elasticity providing bar 132.

In this case, the elasticity providing hole 134 may be formed in a U-shape as well as a U-shape if the elasticity providing bar 132 can provide an elastic force, and it may be formed in a U-shape in the opposite direction to that formed in FIG. 6 (c). However, in terms of the durability of the elasticity providing bar 132, it is preferable to be formed in a U-shape in which the front side is bent as shown in FIG. 6 (c).

As illustrated in FIGS. 6 (a) and (b), in the elasticity providing bar 132, the electronic control device fixing protrusion 138 is formed to protrude inward, and it is preferable that the distance d1 between the oppositely disposed electronic control device fixing protrusions 138 is smaller than the horizontal length of the electronic control device 200.

Accordingly, in a state where the electronic control device 200 is seated on the bracket 100, the elasticity providing bar 132 is elastically deformed toward the outside of the bracket 100, and as the electronic control device fixing protrusion 138 presses the side surface of the electronic control device 200, the electronic control device 200 may be fixed to the inner side of the bracket 100.

As illustrated in FIG. 6 (d), it is preferable that the electronic control device fixing protrusion 138 is formed with an inclined surface for guiding the electronic control device 200 in a direction in which the electronic control device 200 is seated on the bracket such that the user may easily seat the electronic control device 200 on the bracket.

Figure 7:
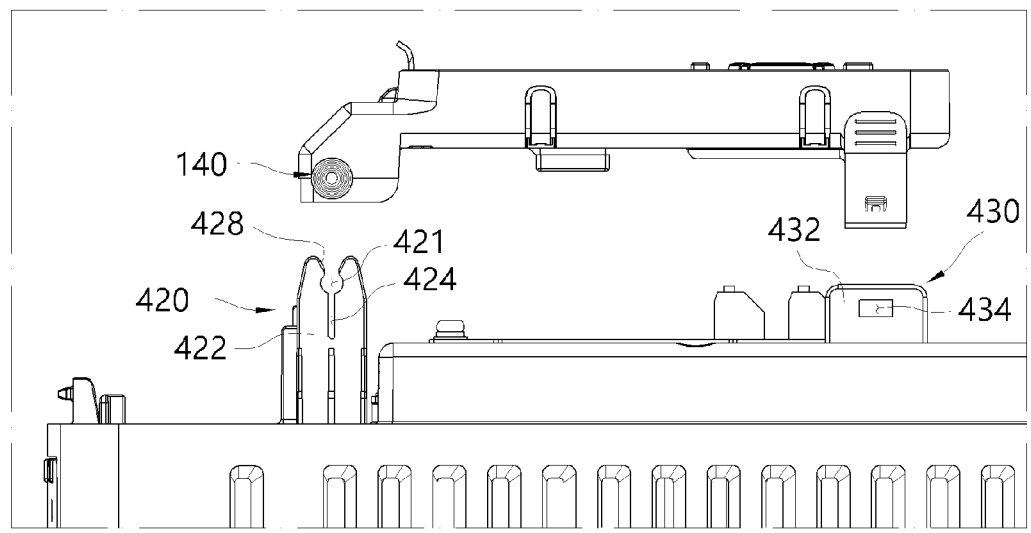
FIG. 7 (a) is a side view of the bracket of the electronic apparatus having an electronic control device according to an exemplary embodiment of the present disclosure, FIG. 7 (b) is a side view of the third coupling part of the electronic apparatus having an electronic control device according to an exemplary embodiment of the present disclosure, and FIG. 7 (c) is a perspective view of the second coupling part of the electronic apparatus having an electronic control device according to an exemplary embodiment of the present disclosure.
Figure 7:
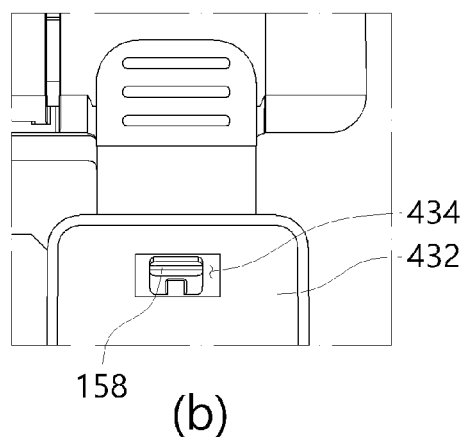
Figure 7:
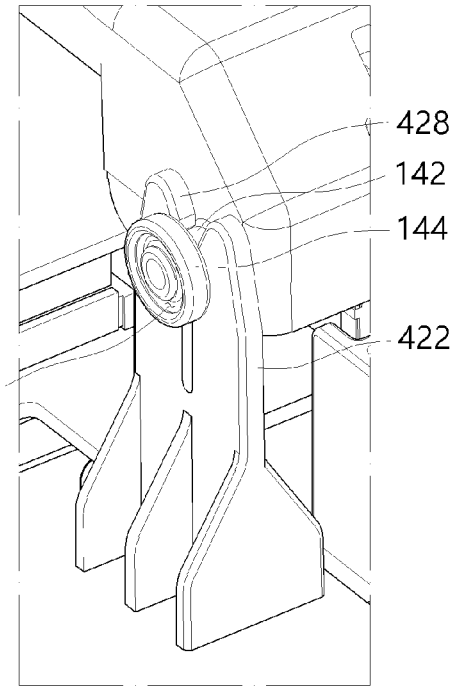
Figure 8:
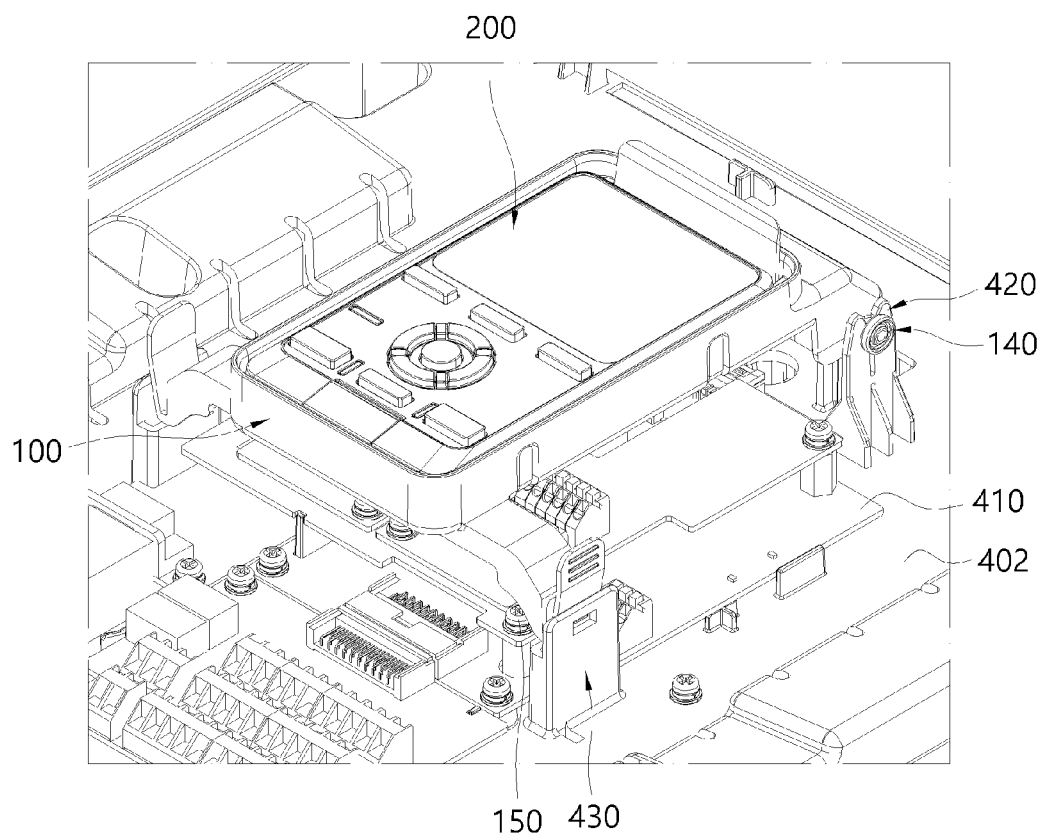
FIG. 8 is a perspective view showing a state in which the bracket of the electronic apparatus having an electronic control device according to an exemplary embodiment of the present disclosure is coupled to a housing.

FIG. 7 (a) is a side view of the bracket of the electronic apparatus having an electronic control device according to an exemplary embodiment of the present disclosure, FIG. 7 (b) is a side view of the third coupling part of the electronic apparatus having an electronic control device according to an exemplary embodiment of the present disclosure, and FIG. 7 (c) is a perspective view of the second coupling part of the electronic apparatus having an electronic control device according to an exemplary embodiment of the present disclosure. FIG. 8 is a perspective view showing a state in which the bracket of the electronic apparatus having an electronic control device according to an exemplary embodiment of the present disclosure is coupled to a housing.

As illustrated in FIGS. 4 to 7, on both side surfaces of one end of the bracket 100 of the electronic apparatus 1 having an electronic control device according to an exemplary embodiment of the present disclosure, a pair of second coupling parts 140 are formed and area coupled to the fourth coupling part 420 formed in the housing 400.

The second coupling part 140 includes a rotating member 142 which is formed to protrude in a cylindrical shape from both side surfaces of one end of the bracket 100 such that the bracket 100 can rotate about the second coupling part 140 while being coupled to the fourth coupling part 420.

In addition, a fixing member 144 is provided at one end of the outer side of the rotating member 142 to prevent the second coupling part 140 from moving in the direction of the rotation axis of the bracket 100 in a state where it is coupled to the fourth coupling part 420. That is, the distance between the pair of fixing members 144 coincides with the distance between the outer surfaces of the pair of fourth coupling parts 420 to be described below such that the movement in the direction of the rotation axis of the bracket 100 is limited.

If the fixing member 144 is formed to have a wider cross-section than the cross-section of the rotating member 142, there is no limit in the exemplary embodiments. Accordingly, it may be formed in a round shape as illustrated in FIGS. 4 (a) and (b).

A groove 146 having a diameter larger than that of the rotating member 142 may be formed on the outer side surface of the fixing member 144. Through this, when the fixing member 144 is manufactured by injection, it is possible to prevent shrinkage and prevent the generation of defective products.

As illustrated in FIG. 4, the second coupling part 140 may be disposed to be adjacent to the first surface 402 which is one surface of the front side of the housing 400 rather than the electronic control device 200 as necessary in light of the trajectory of the bracket rotating with the second coupling part 140 as a rotation axis. Hereinafter, it will be described by defining one surface of the front side of the housing as the first surface 402.

Meanwhile, the fourth coupling part 420 is formed as a pair to correspond to the second coupling part 140, and includes a supporting member 422 and a supporting member seating groove 421.

The supporting member 422 is formed to protrude from the first surface 402 of the housing 400. The distance at which the electronic control device 200 is spaced apart from the housing 400 may be determined according to the height of the supporting member 422.

The supporting member seating groove 421 is formed at one end of the supporting member 422 such that the rotating member 142 is introduced and seated. As illustrated in FIG. 7, the supporting member seating groove 421 is formed in the same shape as the rotation member 142. In this case, the inner side surface of the supporting member seating groove 421 on which the rotating member 142 is introduced is formed to protrude to prevent the rotating member 142 from being separated after the introduction.

In this case, an elastic groove 424 is formed from one side of the supporting member seating groove 421 toward the housing such that the rotating member 142 can be detached from the supporting member seating groove 421.

Accordingly, when the rotating member 142 is introduced into the supporting member seating groove 421 by the elastic groove 424, it comes into contact with the protruding part of the supporting member seating groove 421, and the supporting member 422 may be elastically opened. In addition, after the rotating member 142 is introduced into the supporting member seating groove 421, it may be restored again to prevent the rotating member 142 from being separated.

As illustrated in FIG. 7 (a), a rotating member guide surface 428 is provided on one side of the supporting member seating groove 421 to induce the rotation member 142 to be introduced into the supporting member seating groove 421. In order to describe this in more detail, an inclined surface is formed on the inner side surface of the supporting member seating groove 421 on the side where the rotation member 142 is introduced, and thus, the user may easily introduce the rotation member 142 into the supporting member seating groove 421.

As illustrated in FIGS. 4 to 7, a third coupling part 150 is formed on the opposite side where a pair of second coupling parts 140 of the bracket 100 of the electronic apparatus 1 having an electronic control device according to an exemplary embodiment of the present disclosure are formed, and the third coupling part 150 is coupled to the fifth coupling part 430 formed in the housing 400.

The third coupling part 150 includes a pair of cover supporting members 152, a pair of elasticity providing members 154, an elasticity providing member protrusion 158 and an elasticity providing member handle 156.

A pair of cover supporting members 152 are formed to extend from both side surfaces of the bracket 100. However, as illustrated in FIG. 8, the bracket 100 may be formed to extend from the lower portions of both sides to the outside.

The front side surface of the cover supporting member 152 is formed to be flat. The cover supporting member 152 serves to support the cover 300 to be described below. The detailed description thereof will be provided below.

In addition, as illustrated in FIG. 8, the pair of cover supporting members 152 provide a space in which the circuit board 410 can be disposed between the bracket 100 and the housing 400. In this case, the circuit board 410 is connected to the electronic control device 200 through the through-hole 120 of the bracket 100.

The pair of elasticity providing members 154 are formed to be bent toward the first surface 402 of the housing 400 at one end of the cover supporting member 152. Accordingly, the pair of elasticity providing members 154 may be elastically bent in the bending direction and may be restored again.

As illustrated in FIG. 7 (a), the outer side surface of one end of the elasticity providing member is formed with an elasticity providing member protrusion 158 which is formed to protrude. In addition, an elasticity providing member handle 156 is formed at one end of the elasticity providing member 154. The user may induce elastic deformation of the elasticity providing member 154 by pressing the elasticity providing member handle 156.

The pair of elasticity providing member handles 156 are preferably formed so as to be spaced apart by the distance between the user's thumb and index finger or thumb and middle finger by extending the length of the cover supporting member 152. Through this, the user may easily press the elasticity providing member 154.

Meanwhile, as illustrated in FIG. 7 (a), the fifth coupling part 430 includes an elasticity providing member supporting member 432 which is formed to extend from the first surface 402 of the housing 400 so as to corresponding to the pair of elasticity providing members 154.

An elasticity providing member protrusion seating groove 434 is formed at one end of the elasticity providing member supporting member 432 such that the elasticity providing member protrusion 158 is seated therein. Therefore, it is preferable that the shape of the elasticity providing member protrusion seating groove 434 and the shape of the elasticity providing member protrusion 158 match.

Therefore, as the user presses the elasticity providing member handle 156 toward the bracket 100, the elasticity providing member 154 is elastically deformed such that the elasticity providing member protrusion 158 can be seated in the elasticity providing member protrusion seating groove 434.

In a state where the elasticity providing member protrusion 158 is seated in the elasticity providing member protrusion seating groove 434, the elasticity providing member 154 is restored before the elastic deformation, and the elasticity providing member protrusion 158 maintains a seated state in the elasticity providing member protrusion seating groove 434 by the elastic force, which is the restoring force provided by the pair of elastic providing member 154. Through this, the bracket may be coupled to the third coupling part 150 and the fifth coupling part 430 and fixed to the housing 400.

Meanwhile, since the elasticity providing member 154 between the pair of fifth coupling parts 430 is elastically deformable, even if the second coupling part 140 of the bracket 100 rotates while being fixed to the fourth coupling part 420 and collides with the housing 400, it may serve to reduce the impact.

As illustrated in FIG. 4, a stopper support surface 160 is formed at the side end of the second coupling part 140 side of the bracket 100 of the electronic apparatus 1 having an electronic control device according to an exemplary embodiment of the present disclosure.

In this case, the stopper support surface 160 is formed to be inclined toward the first surface 402 from the side end of second coupling part 140 of the bracket 100. The stopper support surface 160 is supported by a stopper 440 to be described below. However, the method supported by the stopper 440 will be described below.

Figure 9:
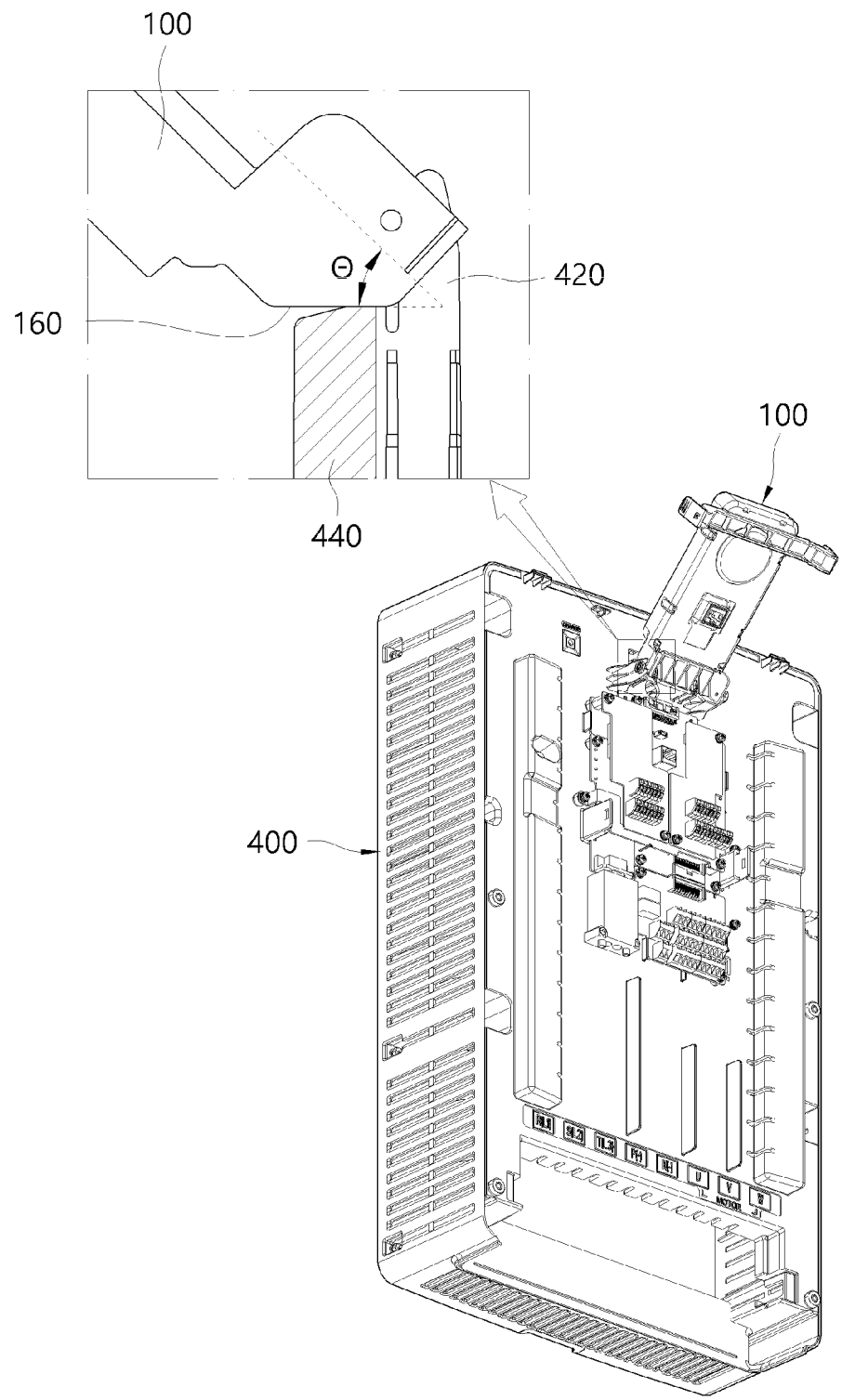
FIG. 9 is an enlarged view of the stopper in an open state of the bracket of the electronic apparatus having an electronic control device according to an exemplary embodiment of the present disclosure.
Figure 10:
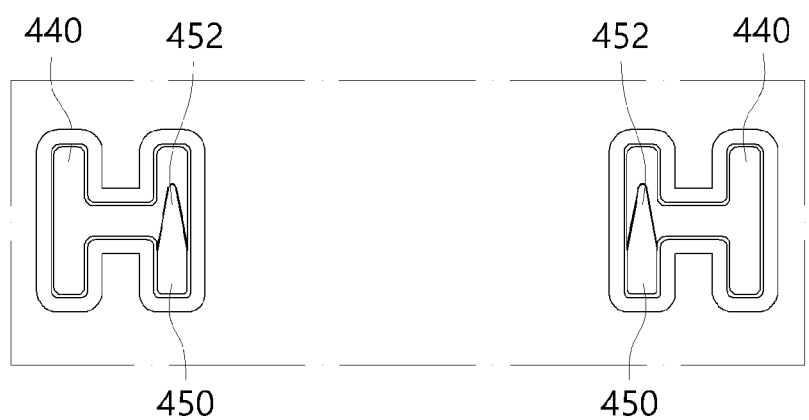
FIG. 10 is an enlarged top view of the stopper of the electronic apparatus having an electronic control device according to an exemplary embodiment of the present disclosure.
Figure 11:
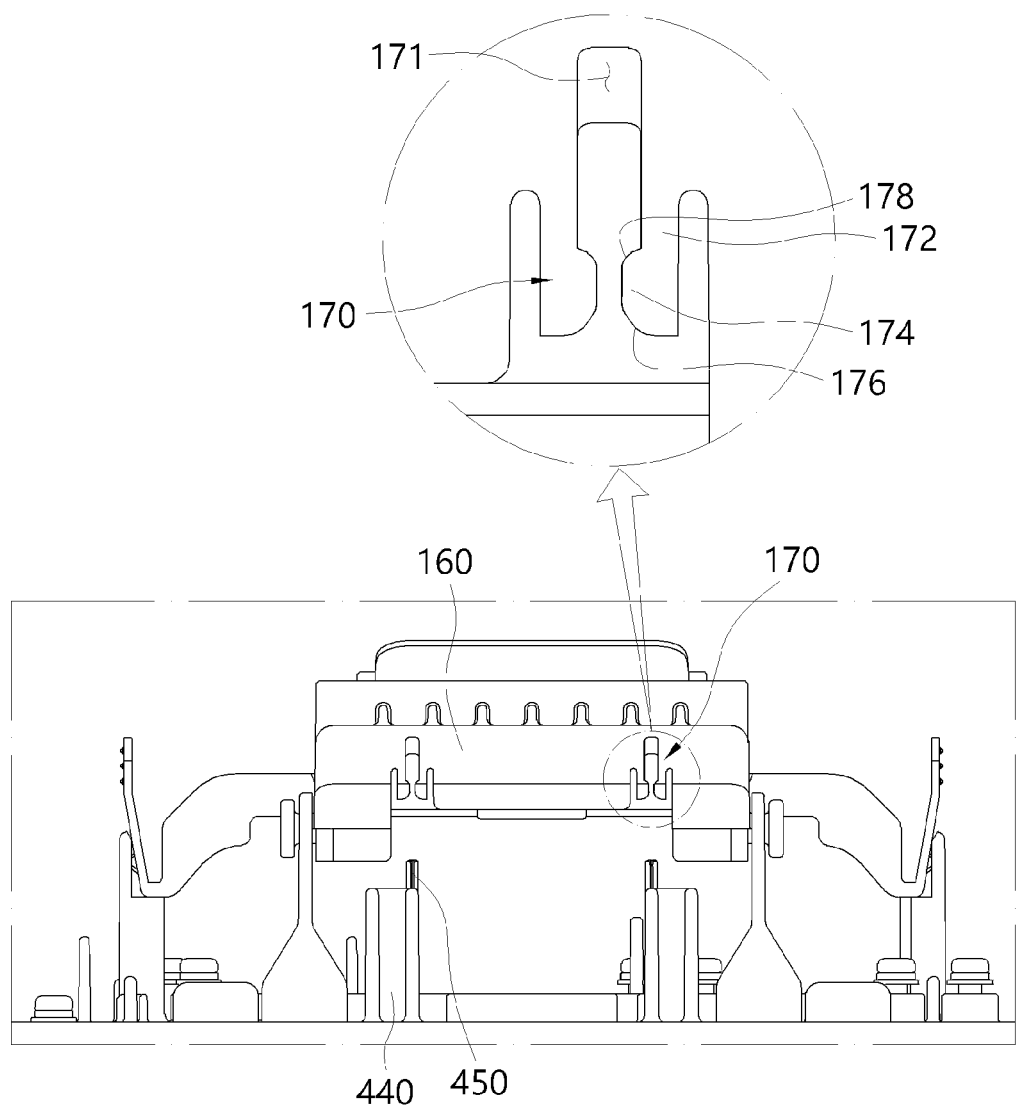
FIG. 11 is a front view showing a state in which the bracket of the electronic apparatus having an electronic control device according to an exemplary embodiment of the present disclosure is coupled to a housing.
Figure 12:
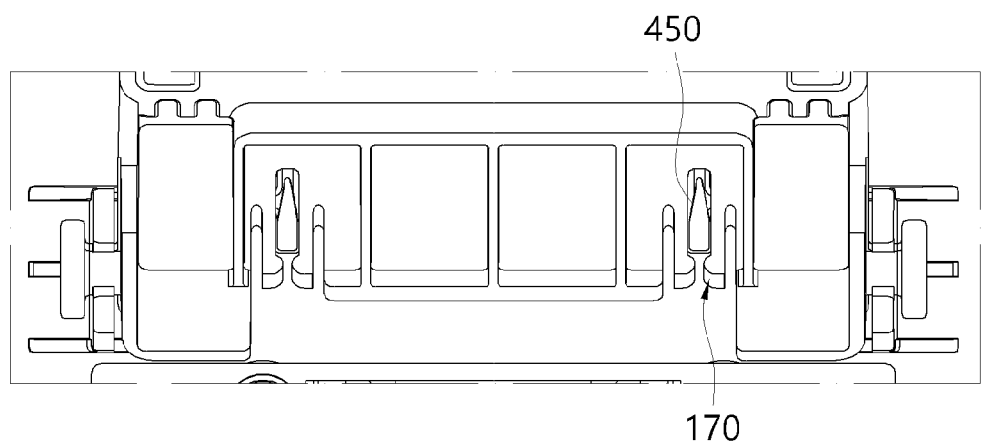
FIG. 12 is an enlarged view of the rotating fixing part in an open state of the bracket of the electronic apparatus having an electronic control device according to an exemplary embodiment of the present disclosure.

FIG. 9 is an enlarged view of the stopper in an open state of the bracket of the electronic apparatus having an electronic control device according to an exemplary embodiment of the present disclosure. FIG. 10 is an enlarged top view of the stopper of the electronic apparatus having an electronic control device according to an exemplary embodiment of the present disclosure, FIG. 11 is a front view showing a state in which the bracket of the electronic apparatus having an electronic control device according to an exemplary embodiment of the present disclosure is coupled to a housing, and FIG. 12 is an enlarged view of the rotating fixing part in an open state of the bracket of the electronic apparatus having an electronic control device according to an exemplary embodiment of the present disclosure.

As illustrated in FIGS. 9 to 12, the electronic apparatus 1 having an electronic control device according to an exemplary embodiment of the present disclosure includes a rotation fixing part 170 and a stopper 440.

The stopper 440 is disposed adjacent to the fourth coupling part 420 which is formed on the first surface 402 of the housing 400, and is formed to protrude from the first surface 402. The number of stoppers 440 is not limited, and as illustrated in FIGS. 10 and 11, two stoppers may be arranged side by side on the pair of fourth coupling parts 420.

One end surface of the front side of the stopper 440 is in contact with the stopper support surface 160 of the bracket 100 to support the stopper support surface 160. Accordingly, the stopper 440 serves to limit the path in which the bracket 100 may rotate.

In this case, as illustrated in FIG. 9, the first angle θ which is formed between the bracket 100 and the first surface 402 of the housing 400 when the bracket 100 rotates about the second coupling part 140 as an axis becomes a predetermined angle as illustrated in FIG. 9 (b). In this case, the size of the first angle θ may vary as needed.

Accordingly, the user may easily perform work on the electronic apparatus 1 in a state where the bracket 100 is opened as illustrated in FIG. 9 (a). For example, the circuit board 410 may be replaced.

Meanwhile, as illustrated in FIGS. 9 to 12, the cross-sectional shape of the stopper 440 is not limited, but it may be formed in an H-shape to easily support the bracket 100 as illustrated in FIG. 10. Through this, there is an advantage in that it is possible to use less material for manufacturing the stopper 440 while having the same supporting force.

As illustrated in FIGS. 10 and 11, a rotation fixing protrusion 450 is formed on one end surface of the stopper 440 to protrude toward the front side. In this case, there is no limitation on the position at which the rotation fixing protrusion 450 protrudes from one end surface of the stopper 440.

The rotation fixing protrusion 450 may be coupled to the rotation fixing part 170 which is formed on the stopper support surface 160 of the bracket 100. That is, in a state where the second coupling part 140 of the bracket 100 is coupled to the fourth coupling part 420, the bracket 100 rotates about the second coupling part 140 as a rotation axis such that when the stopper support surface 160 comes into contact with the stopper 440, the rotation fixing protrusion 450 is coupled to the rotation fixing part 170. Accordingly, when the rotation fixing protrusion 450 is coupled to the rotation fixing part 170, the size of the first angle θ is maintained.

In this case, as illustrated in FIG. 10, the rotation fixing protrusion 450 may be formed to extend lengthwise in the introduction direction of the rotation fixing protrusion 450 to be easily introduced into the rotation fixing part 170.

In addition, a first guide surface 452 may be formed at the end of the rotation fixing protrusion 450 in a direction in which it is introduced into the rotation fixing part 170 so as to induce the rotation fixing protrusion 450 to be introduced into the rotation fixing part 170.

When the first guide surface 452 is described in more detail, as illustrated in FIG. 10, the first guide surface 452 is formed to be inclined on the side surface of the rotation fixing protrusion 450 such that the end of the rotation fixing protrusion 450 in the direction of being introduced into the rotation fixing part 170 is sharp.

In this case, as illustrated in FIG. 10, the first guide surface 452 is preferably formed on both side surfaces of the rotation fixing protrusion 450.

Meanwhile, as illustrated in FIG. 11, the rotation fixing part 170 to which the rotation fixing protrusion 450 is coupled includes a rotation fixing protrusion seating groove 171, a pair of fixing bars 172 and a separation preventing member 174.

If the number of the rotation fixing parts 170 corresponds to the number of the rotation fixing protrusions 450, there is no limitation in the exemplary embodiments of rotation.

The rotation fixing protrusion seating groove 171 is formed in a direction in which the rotation fixing protrusion 450 is introduced from one end of the outer side of the stopper support surface 160. Therefore, when the bracket 100 rotates about the second coupling part 140 as rotation axis in a state where the second coupling part 140 and the fourth coupling part 420 are coupled, the rotation fixing protrusion 450 is introduced into the rotation fixing protrusion seating groove 171.

In this case, as illustrated in FIG. 11, in order to fix the rotation fixing protrusion 450 which is introduced into the rotation fixing protrusion seating groove 171, a pair of fixing bars 172 are formed to extend from one inner surface of the rotation fixing protrusion seating groove so as to be adjacent to both side surfaces of the rotation fixing protrusion 450. Accordingly, the rotation fixing protrusion 450 is disposed between the pair of fixing bars 172 to be fixed.

In this case, a separation preventing member 174 is provided at one end of the pair of fixing bars 172. The separation preventing member 174 is formed to protrude from one end of the pair of fixing bars 172 to the side between the pair of fixing bars 172. Accordingly, even if the rotation fixing protrusion 450 is introduced between the pair of fixing bars 172, it is not easily separated.

When the rotation fixing protrusion 450 is introduced between the pair of fixing bars 172 on which the separation preventing member 174 is formed, it is guided to the first guide surface 452 formed on the rotation fixing protrusion 450, and the rotation fixing protrusion 450 is introduced between the pair of separation preventing members 174, and presses the separation preventing members 174.

In this case, in order for the rotation fixing protrusion 450 to be smoothly introduced between the pair of fixing bars 172, the pair of fixing bars 172 are respectively disposed to be spaced apart from the inner surface of the rotation fixing protrusion seating groove 171.

Accordingly, when the rotation fixing protrusion 450 is introduced between the pair of fixing bars 172, the separation preventing member 174 is pressed by the rotation fixing protrusion 450, and the pair of fixing bars 172 are elastically deformed toward the inner surface of the rotation fixing protrusion seating groove 171, and as illustrated in FIG. 12, the rotation fixing protrusion 450 is disposed between the pair of fixing bars 172 which are formed in the rotation fixing protrusion seating groove 171.

In addition, after the rotation fixing protrusion 450 is seated in the rotation fixing protrusion seating groove 171, a pair of elastically deformed fixing bars 172 are restored to their original shape, and the rotation fixing protrusion 450 is not easily separated from the rotation fixing protrusion seating groove 171 by the separation preventing member 174. Therefore, it is preferable that the distance between the pair of separation preventing members 174 is formed to be narrower than the width of the rotation fixing protrusion 450.

As illustrated in FIG. 11, a second guide surface 176 having an inclination is formed on the inner side surface on which the rotation fixing protrusion 450 is introduced between the pair of separation preventing members 174. The second guide surface 176 is in contact with the first guide surface 452 of the rotation fixing protrusion 450 when the rotation fixing protrusion 450 is introduced so as to guide the rotation fixing protrusion 450 to be introduced between the pair of fixing bars 172.

Accordingly, the user may easily rotate the bracket 100 to perform work while maintaining the bracket 100 in an open state.

Meanwhile, as illustrated in FIG. 11, a third guide surface 178 having an inclination is formed on the other inner side surface on which the rotation fixing protrusion 450 is separated from between the pair of separation preventing members 174. When the third guide surface 178 is separated from between the pair of fixing bars 172 in a state where the rotation fixing protrusion 450 is introduced, it guides the rotation fixing protrusion 450 to be separated along the third guide surface 178.

In this case, it is preferable that the inclination angle of the third guide surface 178 of the separation preventing member 174 is greater than the inclination angle of the second guide surface 176. Accordingly, the user may easily fix the bracket 100 by lifting the same, and fix the rotation fixing protrusion 450 to the rotation fixing protrusion seating groove 171 such that the bracket 100 is not easily separated.

Particularly, in order to prevent the rotation fixing protrusion 450 from being separated from the rotation fixing protrusion seating groove 171 due to the weight of the electronic control device 200 itself, it is preferable that the inclination angle of the third guide surface 178 is formed to be larger than the inclination of the second guide surface 176.

However, even if the rotation fixing protrusion 450 is not separated from the rotation fixing protrusion seating groove 171 due to the weight of the electronic control device 200 itself, the third guide surface 178 is provided such that the user may easily separate the rotation fixing protrusion 450 between the pair of fixing bars 172 in order to move the bracket 100 back to its original position after performing all the tasks.

As illustrated in FIGS. 1 and 2, the electronic apparatus 1 having an electronic control device according to an exemplary embodiment of the present disclosure includes a cover 300.

The cover 300 prevents the bracket 100 and the circuit board 410 from being exposed to the outside by covering one surface of the front side of the housing 400 on which the bracket 100 is disposed. Through this, it is possible to prevent the circuit board 410 from being contaminated by external contaminants.

The cover 300 is coupled to the housing 400 by at least one cover coupling part 330. There is no limitation on the method of being coupled to the housing 400 through the cover coupling part 330, and it may be coupled in a variety of known ways. For example, it may be fixed by screw coupling.

As illustrated in FIGS. 1 and 2, an opening 320 is formed in the cover 300 to expose the front surface of the electronic control device 200 to the outside.

In this case, the edge of the side wall 110 of the bracket 100 is formed to abut against the inner surface of the opening 320. Accordingly, there is not only an effect of preventing external contaminants from being introduced into the cover 300, but also there is an effect that the cover 300 is fixed by the bracket 100.

In this case, as illustrated in FIGS. 1 and 2, an edge included surface 310 may be formed on the edge of the opening 320 such that the front end of the side wall 110 of the bracket 100 does not protrude toward the front side from the cover 300.

In order to describe this in more detail, the edge inclined surface 310 may be formed toward the edge of the bracket 100 from the front end of the edge of the opening 320 such that the height of the protruding front end of the side wall 110 of the bracket 100 coincides with the height of the protruding edge of the opening 320 toward the front side.

Meanwhile, as illustrated in FIG. 2, on the rear surface of the cover 300, a supporting part 340 is formed to protrude toward the rear surface so as to support the cover 300 in contact with the cover supporting member 152. Accordingly, the cover 300 may be supported by the support part 340 to prevent the shape of the cover 300 from being deformed even if the user presses the central portion of the cover 300 regardless of the method of using the electronic apparatus 1.

In this case, a pair of cover supporting member fixing members 342 extending in length toward the rear side of the supporting part 340 may be provided on both sides of the supporting part 340.

The cover supporting member fixing member 342 fixes the cover 300 such that the cover 300 does not move in a direction parallel to the first surface 402 even when the supporting part 340 is supported by the cover supporting member 152. Accordingly, the distance between the pair of cover supporting member fixing members 342 is preferably formed to match the width of the cover supporting member 152.

In the above, the electronic apparatus having an electronic control device according to an exemplary embodiment of the present disclosure has been described. Through the present disclosure, the user may detach the electronic control device from the bracket without using a separate coupling device, replace the circuit board while the electronic control device is fixed to the bracket, and detach the bracket from the housing do. Therefore, through the present disclosure, a plurality of electronic apparatuses may be manipulated by detaching only one electronic control device, or a bracket on which one electronic control device is mounted may be fixed and used for various types of electronic apparatus. It will be apparent to those skilled in the art that these features can be applied to various configurations which are separately connected to the electronic apparatus.

As described above, preferred exemplary embodiments according to the present disclosure have been reviewed, and the fact that the present disclosure can be embodied in other specific forms without departing from the spirit or scope of the present disclosure other than the above-described exemplary embodiments is apparent to those of ordinary skill in the art. Therefore, the above-described exemplary embodiments are to be regarded as illustrative rather than restrictive, and accordingly, the present disclosure is not limited to the above description, but may be modified within the scope of the appended claims and their equivalents.

The invention claimed is:

1. An electronic apparatus having an electronic control device, comprising:
an electronic control device having a first coupling part on one side and an electronic control device groove part on the other side;
a bracket comprising a side wall having a bracket protrusion to be coupled to the electronic control device groove part and a fixing member protrusion seating groove to be coupled to the first coupling part such that the electronic control device is fixed, wherein the bracket comprises a pair of second coupling parts and a pair of third coupling parts and has a through-hole formed in the central portion thereof;
a housing which comprises a pair of fourth coupling parts which are coupled to the second coupling parts such that the bracket is disposed on a first surface and a pair of fifth coupling parts which are coupled to the third coupling parts on the first surface, wherein an electronic apparatus which is controlled by the electronic control device is disposed therein; and
a circuit board electrically which is disposed between the first surface of the housing and the bracket, fixed to the first surface, electrically connected to the electronic apparatus and electrically connected to the electronic control device via the through-hole,
wherein the second coupling part is formed such that the bracket can rotate about the second coupling part in a state where the third coupling part is separated from the fifth coupling part and the second coupling part is coupled to the fourth coupling part,
wherein the housing comprises a stopper which is disposed adjacent to the fourth coupling part and is formed to protrude from the first surface,
wherein a stopper support surface is formed at one side end of the bracket, and when the bracket rotates about the second coupling part, the stopper support surface is formed such that a first angle formed by the bracket and the first surface of the housing is supported by one end surface of the stopper at a predetermined angle, and
wherein a rotation fixing protrusion is formed on one end surface of the stopper, a rotation fixing part is formed on one side of the bracket, and the rotation fixing part is engaged with the rotation fixing protrusion such that the first angle maintains the predetermined angle in a state where the third coupling part is separated from the fifth coupling part and the second coupling part is coupled to the fourth coupling part.

2. The electronic apparatus of claim 1, wherein the rotating fixing part comprises:
a rotation fixing protrusion seating groove which is formed on the stopper support surface and in which the rotation fixing protrusion is seated;
a pair of fixing bars which are formed to extend from one inner surface of the rotation fixing protrusion seating groove so as to be adjacent to both side surfaces of the rotation fixing protrusion; and
a separation preventing member which is formed to protrude from a side surface adjacent to the rotation fixing protrusion of one end of the fixing bar such that the rotation fixing protrusion does not escape to the outside.

3. The electronic apparatus of claim 2, wherein when the rotation fixing protrusion is fastened to the rotation fixing part, a first guide surface having an inclination so as to guide the rotation fixing protrusion between the pair of fixing bars is formed on one surface of the rotation fixing protrusion.

4. The electronic apparatus of claim 3, wherein when the rotating fixing protrusion is introduced between the pair of fixing bars, the pair of fixing bars and the inner surface of the groove are spaced apart such that the fixing bar can be elastically deformed.

5. The electronic apparatus of claim 4, wherein when the rotation fixing protrusion is fastened to the rotation fixing part, a second guide surface having an inclination so as to guide the rotation fixing protrusion between the pair of fixing bars is formed on one surface of the separation preventing member in a direction in which the rotation fixing protrusion is introduced.

6. The electronic apparatus of claim 5, wherein a third guide surface having an inclination so as to guide the rotation fixing protrusion to be separated from between the pair of fixing bars is formed on the other surface of the separation preventing member in a direction opposite to the direction in which the rotation fixing protrusion is introduced.

7. The electronic apparatus of claim 1, wherein the third coupling part comprises a pair of cover supporting members which are formed to extend from both side surfaces of the bracket; a pair of elasticity providing members which are formed to bent toward the first surface at one end of the cover supporting member; an elasticity providing member protrusion which is formed to protrude from one end of the elasticity providing member; and an elasticity providing member handle which is formed at one end of the elasticity providing member, wherein the fifth coupling part comprises an elasticity providing member supporting member which is formed to extend from the first surface so as to correspond to the pair of elasticity providing members; and an elasticity providing member protrusion seating groove which is formed at one end of the elasticity providing member supporting member such that the elasticity providing member protrusion is seated therein, and wherein as the elasticity providing member handle is pressed toward the bracket, the elasticity providing member is elastically deformed such that the elasticity providing member protrusion is seated in the elasticity providing member protrusion seating groove.

8. The electronic apparatus of claim 7, further comprising:
a cover which is formed with an opening to expose one surface of the electronic control device to the outside and covers the one surface of the housing,
wherein a supporting part which is formed to protrude to support the cover in contact with the cover supporting member in a state where the cover is coupled to the housing is provided on one surface opposite to the first surface of the cover.

9. The electronic apparatus of claim 8, wherein the bracket is formed such that the side wall of the bracket is disposed adjacent to the inner side of the edge of the opening, and
wherein the cover is formed to be inclined from the edge of the opening to the edge of the cover such that the height of the side wall end from the first surface and the height of the edge of the opening from the first surface coincide with each other.

10. The electronic apparatus of claim 1, wherein the electronic control device and the circuit board are electrically connected through a wire passing through the through-hole, and
wherein the wire has a predetermined length such that the electronic control device and the circuit board can be electrically connected even in a state where the rotation fixing protrusion is coupled to the rotation fixing part.

11. The electronic apparatus of claim 1, wherein at least one pair of electronic control device fixing parts which are disposed to be opposite to each other are formed on the side wall of the bracket, and
wherein the electronic control device fixing part comprises an elasticity providing hole which is formed in a U-shape; an elasticity providing bar which is formed on the side wall by the elasticity providing hole; and an electronic control device fixing protrusion which is formed on the inner surface of the elasticity providing bar.

12. The electronic apparatus of claim 1, wherein the first coupling part comprises an electronic control device fixing member which is formed to be bent toward the first surface at one end of the electronic control device; a fixing member protrusion which is formed to protrude from one end of the electronic control device fixing member; and a fixing member handle which is formed at one end of the electronic control device fixing member, and
wherein as the fixing member handle is pressed, the electronic control device fixing member is elastically deformed such that the fixing member protrusion is seated in the fixing member protrusion seating groove.

13. An electronic apparatus having an electronic control device, comprising:
an electronic control device having a first coupling part on one side and an electronic control device groove part on the other side;
a bracket comprising a side wall having a bracket protrusion to be coupled to the electronic control device groove part and a fixing member protrusion seating groove to be coupled to the first coupling part such that the electronic control device is fixed, wherein the bracket comprises a pair of second coupling parts and a pair of third coupling parts and has a through-hole formed in the central portion thereof;
a housing which comprises a pair of fourth coupling parts which are coupled to the second coupling parts such that the bracket is disposed on a first surface and a pair of fifth coupling parts which are coupled to the third coupling parts on the first surface, wherein an electronic apparatus which is controlled by the electronic control device is disposed therein; and
a circuit board electrically which is disposed between the first surface of the housing and the bracket, fixed to the first surface, electrically connected to the electronic apparatus and electrically connected to the electronic control device via the through-hole,
wherein the second coupling part is formed such that the bracket can rotate about the second coupling part in a state where the third coupling part is separated from the fifth coupling part and the second coupling part is coupled to the fourth coupling part,
wherein the pair of second coupling parts comprise a rotating member which is formed to protrude in a cylindrical shape from both side surfaces of one end of the bracket,
wherein the pair of fourth coupling parts comprise:

a supporting member which is formed to protrude from the first surface of the housing; and a supporting member seating groove into which the rotation member is introduced and seated at one end of the supporting member, and wherein the supporting member seating groove is formed such that the inner surface of a side into which the rotating member is introduced is formed to protrude so as to prevent the rotating member from escaping in a state where the rotating member is seated.

14. The electronic apparatus of claim 13, further comprising:

a fixing member which is formed at one end of the outer side of the rotating member so as to prevent the second coupling part from moving in the direction of a rotation axis of the bracket in a state where the second coupling part is coupled to the fourth coupling part.

15. The electronic apparatus of claim 13, wherein in the supporting member seating groove, an elastic groove is formed in the longitudinal direction of the supporting member from the supporting member seating groove such that the supporting member seating groove elastically widens when the rotating member is introduced into the supporting member seating groove.

16. The electronic apparatus of claim 15, wherein a rotating member guide surface having an inclination so as to guide the rotating member to be introduced is formed on the inner surface of the supporting member seating groove into which the rotating member is introduced.

\* \* \* \* \*